United States Patent [19]
Williams et al.

[11] Patent Number: 5,817,987
[45] Date of Patent: Oct. 6, 1998

[54] CIRCUIT BOARD HOUSING WITH MOLDED IN HEAT TAB

[75] Inventors: David Williams, Glen Ellyn; John Brett Barry, Downers Grove; Glynn Russell Ashdown, Lake Bluff, all of Ill.

[73] Assignee: Power Trends, Inc., Warrenville, Ill.

[21] Appl. No.: 819,913

[22] Filed: Mar. 18, 1997

[51] Int. Cl.⁶ .............................. H02G 3/08; H05K 7/20
[52] U.S. Cl. .......................................... 174/52.1; 361/720
[58] Field of Search ..................................... 257/706, 707, 257/712, 713; 361/719, 720, 723, 714; 174/52.1, 252

[56] References Cited

U.S. PATENT DOCUMENTS

| | | | |
|---|---|---|---|
| 5,041,902 | 8/1991 | McShane | 257/706 |
| 5,050,038 | 9/1991 | Malaurie et al. | 361/386 |

*Primary Examiner*—Kristine L. Kincaid
*Assistant Examiner*—Hung V. Ngo
*Attorney, Agent, or Firm*—Hill & Simpson

[57] ABSTRACT

The present invention provides a housing for an auxiliary circuit to be connected to a main circuit. The housing includes a heat tab for conducting the heat away from the auxiliary circuit components and an insulating case which is molded together with the heat tab to interlock the heat tab to the case. The case is molded around a chamfered edge of the heat tab. The insulating case includes a back and two sides extending from the back to define an area which contains the auxiliary circuit components. The heat tab is molded into the back and faces the component area so heat generated from the components can be spread to the main circuit by the heat tab. Openings may be provided through the back of the insulating case. The heat tab and legs on the sides of the housing are used to mount the power supply to a circuit board.

19 Claims, 3 Drawing Sheets

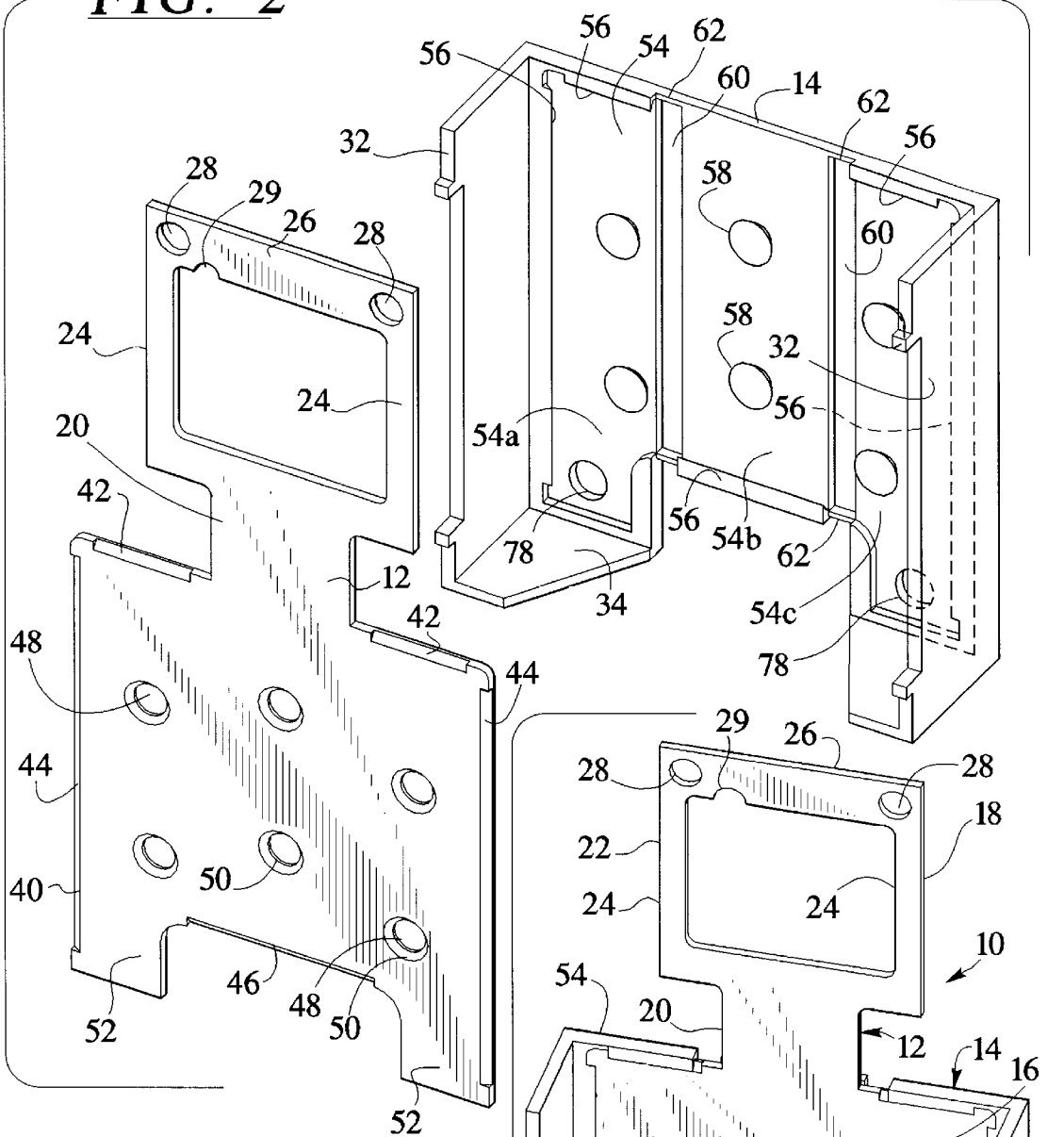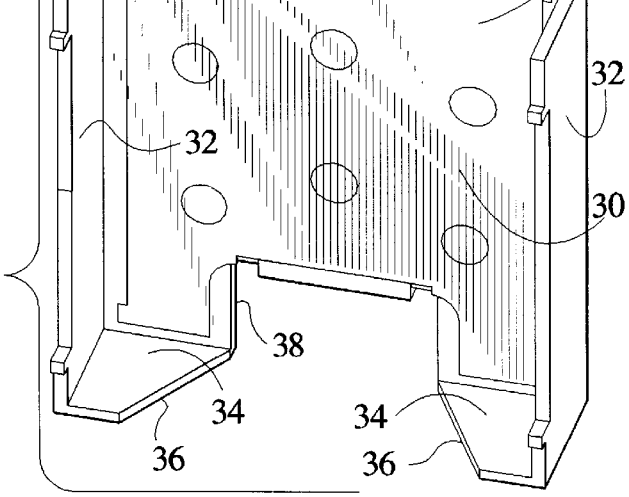

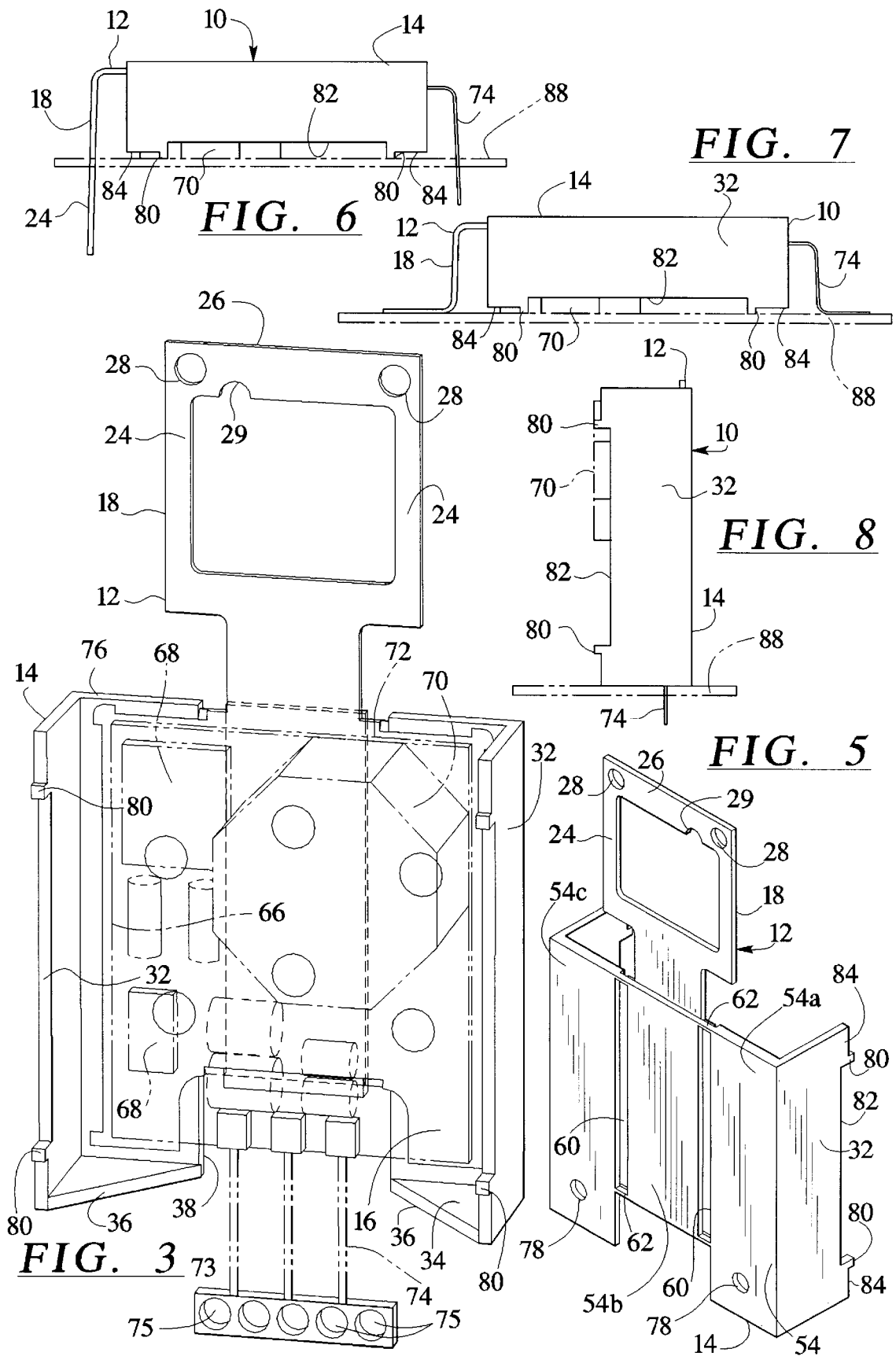

CIRCUIT BOARD HOUSING WITH MOLDED IN HEAT TAB

FIELD OF THE INVENTION

The present invention generally relates to a housing for electronic circuits, and particularly relates to a housing for a circuit board on which is mounted electrical components wherein the housing is mounted to another circuit board, such as a power module which is mounted to a main circuit board.

BACKGROUND OF THE INVENTION

It is becoming increasingly common for a main circuit on a main circuit board, or motherboard, to include auxiliary circuits such as power modules, regulators, DC to DC converters, and AC to DC converters on what is referred to as daughter boards. The auxiliary circuits are mounted to the main circuit boards and are electrically connected into the main circuit.

Mounting of the auxiliary circuit onto the main circuit presents a problem in that bare auxiliary circuit boards do not provide a mounting plane for mounting to the main circuit board. Limitations may be imposed on the mounting orientation of the auxiliary circuit, i.e., horizontal or vertical to the main circuit board, by the environment. Secure mounting which provides a defined mounting plane and which resists vibration of such auxiliary circuit boards is desired.

When the auxiliary circuit is a power module, for example, any heat generated in the auxiliary circuit may be confined to the small auxiliary circuit which can cause the device to operate above the desired operating temperatures. Excessive heat may affect performance and may even damage or destroy the components. The life of the circuit components may be reduced due to excessive operating temperatures.

In one example of a housing for an auxiliary circuit, a plastic housing has the auxiliary circuit adhesively attached within the housing. The auxiliary circuit has a heat conducting metal tab adhered to the back surface of the auxiliary circuit board prior to attachment of the auxiliary circuit in the housing. The auxiliary circuit in the housing is then attached to the main circuit board, such as by soldering.

Manufacture of such an encased auxiliary circuit requires a series of assembly steps. After the auxiliary circuit board has been provided with the electrical circuit components, a heat conducting plate is affixed to the back of the board, such as with a thermally conductive adhesive. In a subsequent step, the board and heat conducting plate are affixed in a housing, also using a thermally conductive adhesive. Curing of the adhesives may also be required. The encased auxiliary circuit is then mounted on a main circuit board, such as by soldering. The flux from the soldering step is washed off the assembled circuit board and power supply in a washing step with, for example, water.

SUMMARY OF THE INVENTION

The present invention provides a housing for an auxiliary electrical circuit that facilitates positioning and mounting of the auxiliary circuit in the housing itself and facilitates mounting and connection of the auxiliary circuit on another electrical circuit such as to a main circuit board. The invention facilitates mounting of the auxiliary circuit on the main circuit board, such as a daughter board on a mother board, in a vertical or horizontal orientation for through-hole or surface mounting. The housing provides protection for the components on the auxiliary board as well as providing a pick and place surface for automated mounting of the auxiliary circuit.

The invention also spreads any heat generated by the auxiliary circuit, such as by distributing the heat from the auxiliary circuit to the main circuit board to reduce hot spots in the circuit. In a preferred embodiment, the housing includes a heat tab which is in thermal contact both with the auxiliary circuit board and with the main circuit board to enable heat flow to the main circuit board through the heat tab. The present auxiliary circuit housing provides particular utility when used to house a power module or power supply for connection in a main electrical circuit because the circuit components in the power supply produce heat during operation of the circuit which is conducted away from the auxiliary circuit by the heat tab and spread to the main circuit board.

The housing is formed by the heat tab and an insulating case which are molded together to form a single piece, which eliminates the step of adhesive bonding of the insulating case and heat tab components together and also eliminates the problems associated with the adhesive bonding process. Formation of the heat tab and the insulating case together gives the housing added strength, provides resistance to breakage, and avoids distortion.

The housing includes a back and two opposite sides extending from the back to define an area which contains the auxiliary circuit board. Portions of a third side are provided to define the endwise position of the auxiliary circuit board. The heat tab of the preferred embodiment is molded into the back of the housing in a way to interlock the heat tab and the insulating case together. The heat tab faces the back plane of the auxiliary board and is thermally conductively bonded thereto so that heat generated by the components in the auxiliary circuit can be spread by the heat tab.

The housing has an opening through the back to provide clearance for electrical leads or pins connected to the auxiliary circuit. The insulating case has channels formed therein to provide thermal stress relief during heating of the present housing, such as during curing of the adhesive, due to the different coefficients of expansion of the heat tab and the insulating case. The channels also aid in positioning the molded in heat tab in the insulating case during molding.

The sides of the housing are shaped to permit easy placement of the auxiliary circuit board in the housing. For example, no fourth side wall is present and the partial third wall is tapered to guide the connection pins of the auxiliary circuit into place. The side walls also serve to protect the components of the auxiliary circuit and to define various mounting planes for different orientations of mounting the housing on the main circuit board. The housing preferably has openings in the side walls and legs extending to the open side which enable mounting of the auxiliary circuit with clearances off of the surface of the main circuit board to permit liquid to escape.

The heat tab of the preferred embodiment is used to mount the housing to the main circuit board in some positions. The heat tab has a first main portion which is secured within the insulating case of the housing and a second leg portion which extends beyond the housing which is originally in an orientation which is substantially co-planer with the first main portion. The orientation and shape of the second leg portion of the heat tab is altered to mount the housing to the main circuit board in a plurality of different positions. For example, the heat tab second leg portion can be bent into an L-shape for mounting in a through-hole arrangement or a Z-shape for surface mounting to the main circuit board. The second leg portion extends from an end of the housing opposite the direction of the connection pins of the auxiliary circuit. Thus, the connection pins affix one end of the housing to the main circuit board and the second leg portion of the heat tab affixes the other end when the housing is mounted in the horizontal orientation.

The preferred second leg portion of the heat tab has a cross bar connecting the distal ends of two spaced parallel legs so that handling during manufacturing and assembly is facilitated without deformation of the legs. The cross bar is preferably cut off before mounting the auxiliary circuit to the main circuit board. Orientation holes may be provided at the cross bar to assist in aligning the housing with the auxiliary circuit board during assembly.

In the embodiment of the present invention with the heat tab molded into the housing, a peripheral edge of the heat tab is shaped so that the plastic material of the housing is molded around the edge to secure the heat tab to the housing even though the heat tab is at the surface of the housing. In particular, the peripheral edge of the heat tab is chamfered, i.e., a corner of the edge is beveled and the insulating case is molded around the chamfered edge. The heat tab may also contain chamfered holes through the heat tab so that the material of the housing extends through the chamfered holes to assist in securing the heat tab to the housing. The chamfered edges act to dovetail the heat tab into the insulating case and thereby securely hold the heat tab within the case.

Molding the heat tab into the housing according to the present invention eliminates the step of adhesive bonding of the heat tab to the housing. Accordingly, power modules and other auxiliary electronic circuits are cheaper and easier to manufacture with fewer assembly steps.

Further embodiments of the invention are provided wherein the heat tab extends up the side walls of the housing instead of being only on the bottom surface or wherein the entire housing is formed of the heat conductive metal. The metal heat tab is molded into the plastic insulating material of the housing, or is coated with the plastic material. Alternately, paint, anodizing, or another insulating coating is applied to the metal heat tab. For some applications, the metal housing may be left bare without the insulating coating.

For auxiliary circuits which do not generate significant amounts of heat, the housing may be formed entirely of plastic insulating material without a metal heat conductor. The benefits of being able mounting the auxiliary circuit in various orientations are still provided.

Other advantages and aspects of the present invention will become apparent after reading this disclosure and reviewing the accompanying drawings.

BRIEF DESCRIPTION OF THE DRAWINGS

FIG. 1 is a perspective view of a housing assembly for use an auxiliary circuit, such as a power supply, to be mounted to a main circuit board;

FIG. 2 is an exploded, perspective view of the housing assembly of FIG. 1 showing a heat tab separated from a plastic body of the case;

FIG. 3 is a perspective view of the present housing showing the auxiliary circuit board mounted therein in phantom;

FIG. 5 is a perspective view of the back side of the housing assembly of FIG. 1;

FIG. 6 is a side elevational view of an auxiliary circuit in the present housing mounted to a main circuit board in a horizontal position in a through-hole configuration;

FIG. 7 is a side elevational view of horizontal position in a surface mount configuration; and FIG. 8 is a side elevational view of an auxiliary circuit in the present housing mounted to a main circuit board in a vertical through-hole orientation.

DETAILED DESCRIPTION OF PREFERRED EMBODIMENTS

Figure 4:
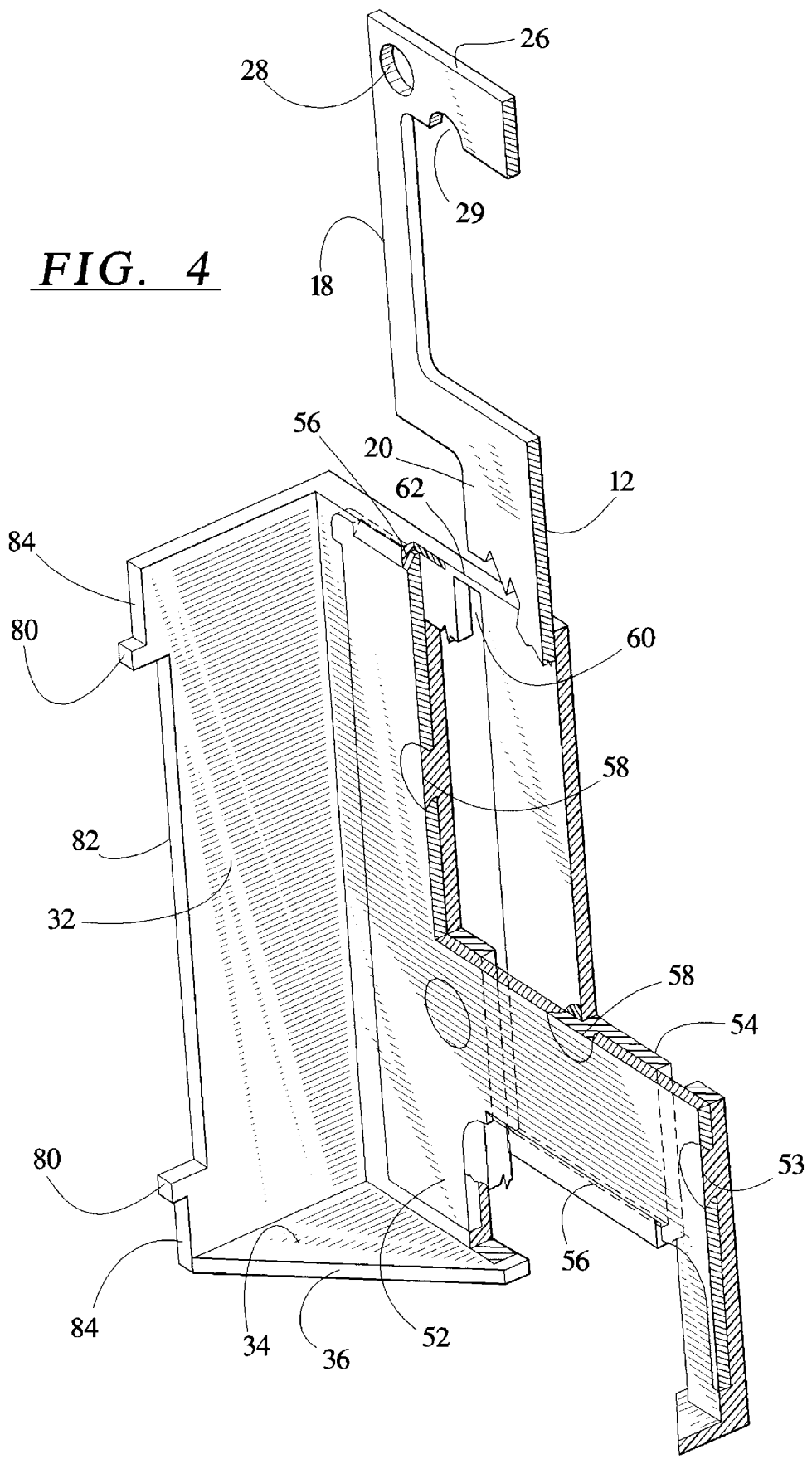
FIG. 4 is a section view of the housing of FIG. 1 with a portion of the assembly broken away.

Although the present invention can be made in many different forms, the preferred embodiments are described in this disclosure and shown in the attached drawings. This disclosure exemplifies the principles of the present invention and does not limit the broad aspects of the invention only to the illustrated embodiments.

FIG. 1 shows a perspective view of a housing assembly 10 for encasing an auxiliary circuit, such as a power module, that is on an auxiliary circuit board and for mounting the auxiliary circuit on a main circuit board. The housing assembly 10 includes a heat tab 12 and an insulating case 14. The heat tab 12 is adapted to spread heat generated by any heat generating components on the auxiliary circuit to the main circuit board and surrounding environments. For example, the heat tab 12 of one embodiment is of a heat conducting material such as hard copper with a tin plating. The heat tab 12 has a first, or main, portion 16 onto which the auxiliary circuit board is mounted. A second, or mounting, portion 18 extends from the main portion 16. The mounting portion is so named because it is used in mounting the housing 10 to the main circuit board in a horizontal orientation as well as being used in mounting the auxiliary circuit into the housing 10. The mounting portion 18 includes a neck 20 and an open frame 22, the frame 22 including a pair of legs 24 and a cross bar 26. Alignment holes 28 are provided in the cross bar 26 as well as an alignment notch 29.

The insulating case 14 is molded around the main portion 16 of the heat tab 12 to secure the heat tab 12 to the insulating case 14. The insulating case 14 defines a space 30 for holding the auxiliary circuit and includes side walls 32 and end wall portions 34. The end wall portions 34 have a taper at 36 leading to a cut out 38 in a back wall of the housing 10. The main portion 16 of the heat tab 12 lies at the surface of the circuit space 30 for thermal contact with a circuit board mounted therein. The insulating case 14 extends about the main portion 16 opposite the circuit space 30 for electrically insulating the exterior of the housing 10.

Referring to FIG. 2, an exploded, perspective view of the housing assembly 10 shows the heat tab 12 separated from the insulating case 14. The main portion 16 of the heat tab 12 has an peripheral edge 40. Portions of the peripheral edge are is chamfered or beveled at a top 42, sides 44 and a bottom 46. Six holes 48 extend through the heat tab 12, the holes 48 also have a chamfered edge 50. The bottom 46 is cut out in a middle section to a accommodate the cut out 38 of the housing 10. This forms two extensions 52.

The insulating case 14 is molded around the main portion 16 of the heat tab 12 to secure the heat tab 12 in the case 14. The molding is performed so that the heat tab 12 is secured at the surface of the component space 30. The insulating case 14 includes a back 54 and the two side walls 32 as well as the end wall 34 extending perpendicularly from the back 54.

The back 54 together with the walls 32 and 34 define the component space 30. As a result of the molding, the back 54 is molded around the beveled edges 42, 44 and 46 of the heat tab 12 to secure the heat tab 12 in the insulating case 14. Side engaging portions 56 are thereby formed. The molding of the insulating case 14 also results in the material of the insulating case extending through the openings 48 in the heat tab 12 as shown at hole engaging portions 58. The case 14 is constructed from an electrically insulating plastic in a preferred embodiment.

The insulating case 14 is provided with channels 60 that extend vertically and that nearly divide the back 54 of the case 14 into three parts 54a, 54b and 54c. The channels 60 provide thermal stress relief as the heat tab 12 and the case 14 expand and contract at different rates due to the different coefficients of thermal expansion and thereby prevent distortion of the housing. This is important during heating and cooling of the auxiliary circuit but is even more important to prevent cracking of the housing during thermal curing of the adhesive which secures the auxiliary circuit board into the housing 10. Depending on the length of the channels 60, small bridging links 62 may extend between the parts 54a, 54b and 54c of the case 14.

Although shown with the heat tab 12 extending over the back wall of the housing, it is contemplated to provide the heat tab extending up the side walls of the housing as well. Alternately, the heat tab may extend up the side walls and the end wall to define the shape of the entire housing. Such an embodiment would only need a coating of plastic insulator, paint, anodizing or other material to provide the insulation. As indicated above, the insulating layer may be omitted when not needed so that an all metal embodiment is also possible. Yet another possible embodiment provides that the entire housing is formed of the insulating plastic. Although less effective in thermal conductivity, this all plastic embodiment would provide some thermal spreading and retain the other advantages of the invention.

The housing 10 is shown with an auxiliary power module circuit 66 is shown in FIG. 3 in phantom. The circuit 66 has components 68, such as power supply circuit components and including a toriod coil 70, mounted on a circuit board 72. Contact pins 74 extend from the circuit board for electrical connection between the auxiliary circuit and the main circuit. The contact pins 74 are connected together by a tie bar 73 which has alignment holes 75. The components 68 may generate heat during operation. The back plane of the circuit board 72 is mounted in thermal contact with the main portion 16 of the heat tab 12 such as using a thermally conductive adhesive. The housing 10 is preferably sized to fit the auxiliary circuit board 72 snugly, with the circuit board 72 extending fully between the side walls 32 and from the end walls 34 to a top edge of the insulating case 14.

Positioning and mounting of the auxiliary circuit board 72 in the housing 10 may be performed manually or by automatic machines. The precise position of the housing 10 is defined by pins extending through the alignment holes 28. Precise positioning of the auxiliary circuit is defined by pins extending through the openings 75 in the tie bar 73. The taper 36 on the end walls 34 guide the contact pins 74 into position. The circuit board 72 may be inserted in a direction perpendicular to the heat tab 12 or may be inserted parallel thereto in a direction from the mounting portion 18 since no top wall is provided at top edge 76. Once the auxiliary circuit board 72 is in place, clearance for the contact pins 74 is provided by the cut out 38. The pins 74 engage each side of the edge of the circuit board, so the cut out is desired to ensure that the back plane of the auxiliary circuit board rests against the main portion of the heat tab 12. The tie bar 73 is removed prior to mounting of the contact pins 74 in the main circuit board 88.

In FIG. 4, the heat tab 12 can be seen exposed at the surface of the component side of the back wall 54 of the housing 10. The back wall 54 of the insulating case 14 covers the surface of the heat tab 12 opposite the auxiliary circuit so that the metal heat tab 12 is electrically insulated from contact with wiring, components, etc. During molding of the insulating case 14, care must be taken to ensure that the heat tab 12 does not deform toward the back surface of the housing 10 and out of thermal contact with the auxiliary circuit. The portions of the mold which form the channels 60 also ensure proper disposition of the heat tab 12 during molding. Posts in the mold extend to the heat tab 12 through the back wall 54 to support the heat tab 12 during molding to ensure positioning of the heat tab 12 at the surface of the component space; these posts result in holes 78 in the back wall 54, as shown in FIGS. 2 and 5.

The engagement of the molded insulating case 14 at the beveled peripheral edges 42, 44 and 46 and the beveled hole edges 50 may be clearly seen in FIG. 4. It is important that the beveled edges be oriented properly for engagement of the heat tab 12 in the housing 10. The alignment notch 29 is provided in the cross bar 26 for easy determination of the direction of the bevel during molding of the housing 10. The invention thereby provides secure engagement of the heat tab 12 in the insulating case 14. The molded-in heat tab 12 provides a much stronger housing without adding thickness.

Also shown in FIG. 4 is the shaping of the side wall edge. The side walls 32 of the housing 10 include legs 80. Four such legs 80 are provided, two on each side wall 32. The legs 80 extend from the side walls 32 to increase the effective height of the sides. When positioned open side down in what is referred to as horizontal mounting, the legs 80 rest on the main circuit board, also referred to as the mother board, as shown in FIGS. 6 and 7. The legs 80 raise edge of the side walls above the main circuit board so that any liquid trapped in the housing during a washing step is able to escape. Washing fluids, which are used when the auxiliary circuit within the housing 10 is soldered to the main circuit board and the flux is washed off, are able to easily escape by spacing the housing 10 from the main circuit board while still providing stable mounting of the housing 10. The legs 80 may fit into openings in the main circuit board for precise alignment. Even when the legs 80 are positioned in openings in the main circuit board, the edge of the side walls 32 is not sealed against the main circuit board since a portion 82 of the side walls 32 between the legs 80 is cut out relative to side wall portions 84 outside the legs 80. Furthermore, the circuit components on the auxiliary circuit board 72, e.g., the coil 70, are not mashed against the main circuit board due to the spacing effect of the legs 80. The component space 30, thus, has a depth defined by the distance from the face of the heat tab 12 to the tip of the leg 80. The depth of the component space 30 is at least as great as a combined height of the auxiliary circuit board 72 and the most prominent component 70.

FIG. 5 shows thermal relief channels 60 through which the heat tab 12 is exposed at the back wall 54 of the housing assembly 10. The heat tab 12 and the insulating case 14 expand at different rates during heated and cooling such as during curing of the adhesive used in bonding of the auxiliary circuit 72 to the heat tab 12. The channels 60 allow for relative expansion and contraction between the heat tab 12 and the insulating case 14 so that warping or cracking of these parts due to thermal expansion and contraction is prevented.

FIG. 6 shows mounting of the housing 10 on a main circuit board 88 in a horizontal orientation. The cross bar 26 has been cut off so that the legs 24 of the mounting portion 18 remain. The mounting portion 18 is bent at an angle to form an L shape. The contact pins 74 on the auxiliary circuit board 72 are also bent in an L shape. The contact pins 74 and the legs 24 of the heat tab are inserted through openings in the main circuit board 88. A soldering operation is performed to connect the pins 74 and legs 24. After soldering, the washing step to remove the solder flux does not result in trapped liquid due to the spacing of the side walls 32 from the main circuit board 88 by the legs 80 and the cut out 82.

Heat from the operation of the auxiliary circuit is conducted by the heat tab 12 to the main circuit board 88 and is thereby spread so that hot spots are avoided. The heat tab 12 may function as a heat sink itself as well. The electrical connections to the auxiliary circuit for its operation are provided through the pins 74. Together, the pins 74 and the legs 24 of the heat tab 12 hold both ends of the housing 10 to the main circuit board 88 for vibration free mounting.

A surface mount horizontal orientation for the housing 10 is shown in FIG. 7. The cross bar 26 of the mounting portion 18 is removed as explained above and the mounting portion 18 and contact pins 74 are formed into a Z shape for connection at the surface of the main circuit board 88. The secure mounting of both ends of the housing 10 and the thermal distribution by the heat tab 12 is provided in this embodiment without requiring through holes in the main circuit board 88.

The housing 10 of the present invention provides a mounting plane for other orientations as well. In FIG. 8, contact pins 74 extend straight from the auxiliary circuit through openings in the main circuit board 88. The end walls 36 thereby define the mounting plane of the housing 10. The heat tab 12 in this arrangement generally has the mounting portion 18 removed. However, the mounting portion 18 may be left in place to extend into a air flow to provide a heat dissipation function.

Another orientation for mounting the housing 10 to the main circuit board 88 is by adhesive bonding of the parts together. The housing 10 is mounted to the main circuit board 88 by adhesive bonding the back side 34 of the housing 10 to the main circuit board 88. In this mounting position, the component area 30 faces away from the main circuit board 88. The mounting portion 18 of the heat tab 12 is either shaped for extending through openings in the main circuit board 88, shaped for surface mounting, or removed from the first main portion 16 at the junction between these two parts.

A method of making the housing 10 includes the following steps. The above disclosure may clarify these steps and describe additional steps to make and use the housing 10. The heat tab 12 is made from the desired heat conductive material. The housing assembly 10 is made by molding the insulating case 14 around the heat tab 12 to lock the heat tab 12 and the case 14 together. The auxiliary circuit board 72 is mounted to the housing assembly 10. In particular, the auxiliary circuit board 72 is adhesive bonded to the heat tab 12 in the component area 30 by a thermal adhesive. The thermal adhesive is cured by heating and then cooling for a prescribed period of time. The channels 60 accommodate differences in thermal coefficients of expansion during this step. The second mounting portion 18 of the heat tab 12 is modified, such as by removal of the cross bar and forming into shape, according to the desired method of mounting the housing 10 to the main circuit board 88. The housing 10 is mounted to the main circuit board 88 and the assembly is washed and dried.

The mounting portion 18 of the heat tab 10 may be shaped in various ways to mount the housing and/or to provide heat spreading. Removal of the cross bar 26 or of some or all of the legs 24 is possible although not required.

Alternate embodiments of the present housing 10 which may be used in auxiliary circuits which produce little or no heat provide that the housing is entirely of plastic or other insulating material. The mounting planes provided by the all plastic housing enable the auxiliary circuit to be mounted on the main circuit board 88 in either a horizontal or vertical orientation and protects the circuit both physically and electrically.

For heat producing auxiliary circuits, the heat tab 12 is shaped so that the main portion 16 extends up the side walls 32 of the housing 10. The heat tab 10 may comprise the entire housing as another alternative. An insulating coating such as paint, anodizing or plastic is preferably provided over the metal heat tab of this embodiment of the housing, although this may not be necessary in some applications.

The housing of the present invention may be formed of a variety of materials, wherein the heat tab is of a thermally conductive material and the insulating case is of an electrically insulating material. The housing may be of different sizes and proportions to accommodate different sizes and shapes of auxiliary circuit boards.

While the preferred embodiments have been illustrated and described, numerous changes and modifications can be made without significantly departing from the spirit and scope of this invention. Therefore, the inventor intends that such changes and modifications are covered by the appended claims.

We claim as our invention:

1. A housing for receiving an auxiliary circuit board and for mounting on a main circuit board, comprising:
   a heat tab adapted to spread heat generated by components on the auxiliary circuit board; and
   an insulating case having side walls extending generally perpendicular to said heat tab to define a component area adapted to receive the auxiliary circuit board, the insulating case being molded around at least part of the heat tab to secure the heat tab in the insulating case such that the heat tab faces the component area.

2. The housing assembly of claim 1, wherein the heat tab comprises:
   a first portion molded into the insulating case; and
   a second portion integral with the first portion and extending away from the insulating case.

3. The housing assembly of claim 2, wherein the first portion of the heat tab has a peripheral edge in which at least part of the peripheral edge is chamfered with a bevel, and wherein the insulating case is molded around the chamfered peripheral edge.

4. The housing assembly of claim 3, wherein the bevel on the peripheral edge faces the component area.

5. The housing assembly of claim 1, wherein the heat tab has edges, at least part of the edges is chamfered with a bevel, and wherein the insulating case is molded around the bevel.

6. The housing assembly of claim 5, wherein the bevel of the heat tab edges is only partially through a material thickness of the heat tab.

7. The housing assembly of claim 2, wherein the second portion of the heat tab is removable from the first portion of the heat tab by cutting the second portion from the first portion.

8. The housing assembly of claim 2, wherein the second portion of the heat tab comprises legs extending away from the first portion of the heat tab.

9. The housing assembly of claim 2, wherein the second portion of the heat tab is movable by bending from a first position which is substantially co-planer with the first portion of the heat tab to a second position at an angle to the first portion of the heat tab.

10. The housing assembly of claim 9, wherein the second portion of the heat tab is L-shaped.

11. The housing assembly of claim 9, wherein the second portion of the heat tab is Z-shaped.

12. The housing assembly of claim 1, wherein the insulating case comprises a back and two sides extending from the back, the back and sides defining the component area, and wherein the back is molded around the at least part of the heat tab.

13. The housing assembly of claim 12 wherein each side has a leg extending from the side, the side and leg defining a mounting plane.

14. The housing assembly of claim 1, wherein said insulating case includes a back opposing the component area, and wherein the insulating case defines an opening such that the heat tab is exposed through the opening at the back of the insulating case.

15. A housing assembly for receiving an auxiliary circuit board and for mounting on a main circuit board, comprising:
   a heat tab adapted to spread heat generated by components on the auxiliary circuit board; and
   an insulating case defining a component area adapted to receive the heat generating components, the insulating case being molded around at least part of the heat tab to secure the heat tab in the insulating case such that the heat tab faces the component area,
   said heat tab including:
      a first portion molded into the insulating case; and
      a second portion integral with the first portion and extending away from the insulating case;
      wherein the first portion of the heat tab defines a hole through the first portion, the hole having a chamfered edge, and wherein the housing is molded around the chamfered edge of the hole.

16. The housing assembly of claim 15, wherein the chamfered edge on the hole faces the component area.

17. A housing assembly for use in mounting an auxiliary circuit to a main circuit board, the housing assembly comprising:
   a heat tab constructed from a heat conducting material; and
   an insulating case having an opening, wherein the heat tab and the insulating case interlock with each other such that the heat tab is secured within the opening in a position to thermally contact the auxiliary circuit, said insulating case including walls defining a space for mounting the auxiliary circuit.

18. The housing assembly of claim 17, wherein the insulating case is molded around at least part of the heat tab to define the opening and to secure the heat tab in the insulating case.

19. The housing assembly of claim 17, wherein the insulating case abuts an edge of the heat tab to interlock the heat tab and the insulating case together.

* * * * *